(12) United States Patent
Li et al.

(10) Patent No.: US 11,953,568 B1
(45) Date of Patent: Apr. 9, 2024

(54) WIDE-RANGE PERPENDICULAR SENSITIVE MAGNETIC SENSOR AND METHOD FOR MANUFACTURING THE SAME

(71) Applicant: DIGITAL GRID RES. INST., CHINA SOUTHERN PWR. GRID, Guangzhou (CN)

(72) Inventors: Peng Li, Guangzhou (CN); Qiancheng Lv, Guangzhou (CN); Bing Tian, Guangzhou (CN); Zejie Tan, Guangzhou (CN); Zhiming Wang, Guangzhou (CN); Jie Wei, Guangzhou (CN); Renze Chen, Guangzhou (CN); Xiaopeng Fan, Guangzhou (CN); Zhong Liu, Guangzhou (CN); Zhenheng Xu, Guangzhou (CN); Senjing Yao, Guangzhou (CN); Licheng Li, Guangzhou (CN); Yuehuan Lin, Guangzhou (CN); Shengrong Liu, Guangzhou (CN); Bofeng Luo, Guangzhou (CN); Jiaming Zhang, Guangzhou (CN); Xu Yin, Guangzhou (CN)

(73) Assignee: DIGITAL GRID RES. INST., CHINA SOUTHERN PWR. GRID, Guangzhou (CN)

( * ) Notice: Subject to any disclaimer, the term of this patent is extended or adjusted under 35 U.S.C. 154(b) by 0 days.

(21) Appl. No.: 18/242,624

(22) Filed: Sep. 6, 2023

(30) Foreign Application Priority Data

Sep. 23, 2022 (CN) .......................... 202211169132.8

(51) Int. Cl.
*G01R 33/09* (2006.01)
*H10N 35/00* (2023.01)
*H10N 35/01* (2023.01)

(52) U.S. Cl.
CPC ........... *G01R 33/098* (2013.01); *H10N 35/01* (2023.02); *H10N 35/101* (2023.02)

(58) Field of Classification Search
CPC ..... G01R 33/098; H10N 35/01; H10N 35/101
See application file for complete search history.

(56) References Cited

U.S. PATENT DOCUMENTS

| 2013/0106410 A1* | 5/2013 | Liu ...................... G01R 33/098 324/246 |
| 2015/0204951 A1* | 7/2015 | Holm ................... G01R 33/098 324/252 |

(Continued)

FOREIGN PATENT DOCUMENTS

| CN | 103267955 A | 8/2013 |
| CN | 103414176 A | 11/2013 |

(Continued)

OTHER PUBLICATIONS

Chinese Office Action for corresponding Application No. 202211169132.8 dated Nov. 1, 2022, 15 pages.

(Continued)

*Primary Examiner* — Alvaro E Fortich
(74) *Attorney, Agent, or Firm* — Seyfarth Shaw LLP

(57) ABSTRACT

The present disclosure relates to a wide-range perpendicular sensitive magnetic sensor and the method for manufacturing the same, the magnetic sensor includes a substrate, a plurality of magnetic tunnel junctions, a plurality of magnetic flux regulators, a first output port and a second output port.

12 Claims, 5 Drawing Sheets

(56) References Cited

U.S. PATENT DOCUMENTS

| | | | | |
|---|---|---|---|---|
| 2016/0109535 A1* | 4/2016 | Deak | .................... | G01R 17/105 |
| | | | | 324/252 |
| 2020/0194311 A1* | 6/2020 | Tang | .................... | H01L 27/105 |
| 2021/0055360 A1* | 2/2021 | Mauri | ................ | G01R 33/0094 |

FOREIGN PATENT DOCUMENTS

| CN | 103645449 A | 3/2014 |
|---|---|---|
| CN | 104776794 A | 7/2015 |
| CN | 109142784 A | 1/2019 |
| CN | 109738838 A | 5/2019 |
| CN | 110109039 A | 8/2019 |
| CN | 111007442 A | 4/2020 |
| CN | 111505544 A | 8/2020 |
| CN | 112858720 A | 5/2021 |
| CN | 114497362 A | 5/2022 |
| CN | 114937736 A | 8/2022 |

OTHER PUBLICATIONS

Chinese Office Action for corresponding Application No. 202211169132.8 dated Nov. 24, 2022, 15 pages.

* cited by examiner

WIDE-RANGE PERPENDICULAR SENSITIVE MAGNETIC SENSOR AND METHOD FOR MANUFACTURING THE SAME

CROSS-REFERENCE TO RELATED APPLICATIONS

The present application claims priority to Chinese patent application No. 2022111691328, filed on Sep. 23, 2022, the entire content of which is incorporated herein by reference.

TECHNICAL FIELD

The present disclosure relates to the field of sensors, and in particular, to a wide-range perpendicular sensitive magnetic sensor and a method for manufacturing the same.

BACKGROUND

As a modern cutting-edge technology, magnetic sensors can convert changes of a magnetic field into other physical changes to realize a detection function of the magnetic field. Magnetic sensors are small in size and low in price, and can be integrated with other circuits on a chip to achieve higher performance. Therefore, magnetic sensors are widely used in various practical scenarios, such as geological exploration, biomedicine, automotive industry, electronic products, etc., which greatly improves people's working efficiency and increase the convenience of life.

Currently, with the development of magnetic field detection technology, many different types of magnetic sensors for measuring magnetic fields and other parameters have emerged in the related art, such as Hall elements, anisotropic magnetoresistive (AMR) elements, giant magnetoresistive (GMR) elements, tunneling magnetoresistive (TMR) elements, giant magnetic impedance (GMI) elements, and so on. A Hall element is a semiconductor device that applies the Hall effect. A magnetic sensor that uses the Hall element as a sensitive element typically uses a magnetism gathering annular structure to amplify the magnetic field.

However, with the increasing demand for magnetic sensors and the increasing complexity of application scenarios, magnetic sensors of different technologies have their own advantages in range, sensitivity, and other aspects. For different magnetic fields, different detection ranges are often required to achieve full coverage detection. However, the two indicators of sensitivity and range of different magnetic sensors have problems in practical application requirements. For example, for the Hall elements, low sensitivity is the main problem. The TMR element has a problem in that sensitivity and range are constrained to each other under a certain size of the TMR element. Therefore, the problem of simultaneously improving the sensitivity and range of the magnetic sensor needs to be solved urgently.

SUMMARY

In a first aspect, the present disclosure provides a wide-range perpendicular sensitive magnetic sensor, including a substrate, a plurality of magnetic tunnel junctions, a plurality of magnetic flux regulators, a first output port and a second output port. The plurality of magnetic tunnel junctions are arranged on the substrate, and the plurality of magnetic flux regulators are arranged above the plurality of magnetic tunnel junctions. The plurality of magnetic tunnel junctions include at least one first magnetic tunnel junction and at least one second magnetic tunnel junction. The at least one first magnetic tunnel junction is located below the magnetic flux regulator, and edges of the at least one first magnetic tunnel junction not exceed edges of the magnetic flux regulator from a top-down perspective. The at least one second magnetic tunnel junction is located below a gap between two adjacent magnetic flux regulators, and edges of the at least one second magnetic tunnel junction not contact with the edges of the magnetic flux regulator on either side from the top-down perspective. The at least one first magnetic tunnel junction and the at least one second magnetic tunnel junction are arranged in partitions on the substrate. The first output port is connected to the at least one first magnetic tunnel junction, and the second output port is connected to the at least one second magnetic tunnel junction. The first output port and the second output port are both configured to output a sensing signal representing a magnetic induction intensity of a magnetic field in a Z-axis direction, and the Z-axis direction is a direction perpendicular to the substrate. A magnetic sensing direction of the at least one first magnetic tunnel junction is a positive direction of the Z-axis, and a magnetic sensing direction of the at least one second magnetic tunnel junction is a negative direction of the Z-axis; or the magnetic sensing direction of the at least one first magnetic tunnel junction is the negative direction of the Z-axis, and the magnetic sensing direction of the at least one second magnetic tunnel junction is the positive direction of the Z-axis. The magnetic sensor includes a voltage input port and a ground port. The first output port includes a first positive output port and a first negative output port, and the first output port is configured to output a voltage of the at least one first magnetic tunnel junction. The voltage of the at least one first magnetic tunnel junction is linearly related to magnetic reluctance of the at least one first magnetic tunnel junction, and the magnetic reluctance of the at least one first magnetic tunnel junction is linearly related to an external magnetic field. The first positive output port, the first negative output port, the voltage input port, the ground port and the at least one first magnetic tunnel junction form a first push-pull Wheatstone full-bridge structure. The second output port includes a second positive output port and a second negative output port, and the second output port is configured to output a voltage of the at least one second magnetic tunnel junction. The voltage of the at least one second magnetic tunnel junction is linearly related to magnetic reluctance of the at least one second magnetic tunnel junction, and the magnetic reluctance of the at least one second magnetic tunnel junction is linearly related to the external magnetic field. The second positive output port, the second negative output port, the voltage input port, the ground port, and the at least one second magnetic tunnel junction form a second push-pull Wheatstone full-bridge structure.

In some embodiments, the at least one first magnetic tunnel junction and the at least one second magnetic tunnel junction may also be alternately arranged on the substrate.

In some embodiments, the voltage input port, the ground port, the first output port, the second output port, the at least one first magnetic tunnel junction and the at least one second magnetic tunnel junction are all connected by connecting lines.

In some embodiments, the magnetic sensor includes a plurality of first magnetic tunnel junctions. The plurality of first magnetic tunnel junctions form a first magnetic reluctance circuit, a second magnetic reluctance circuit, a third magnetic reluctance circuit and a fourth magnetic reluctance circuit. The first magnetic reluctance circuit, the second magnetic reluctance circuit, the third magnetic reluctance circuit and the fourth magnetic reluctance circuit each include at least one first magnetic tunnel junction. A first end of the first magnetic reluctance circuit is connected to a first end of the second magnetic reluctance circuit, a second end of the second magnetic reluctance circuit is connected to a first end of the third magnetic reluctance circuit, a second end of the third magnetic reluctance circuit is connected to a first end of the fourth magnetic reluctance circuit, and a second end of the fourth magnetic reluctance circuit is connected to a second end of the first magnetic reluctance circuit. The first positive output port is respectively connected to the first end of the first magnetic reluctance circuit and the second end of the fourth magnetic reluctance circuit, the first negative output port is respectively connected to the second end of the second magnetic reluctance circuit and the first end of the third magnetic reluctance circuit, the voltage input port is respectively connected to the second end of the first magnetic reluctance circuit and the first end of the second magnetic reluctance circuit, and the ground port is respectively connected to the second end of the third magnetic reluctance circuit and the first end of the fourth magnetic reluctance circuit.

In some embodiments, the magnetic sensor includes a plurality of second magnetic tunnel junctions. The plurality of second magnetic tunnel junctions form a fifth magnetic reluctance circuit, a sixth magnetic reluctance circuit, a seventh magnetic reluctance circuit and an eighth magnetic reluctance circuit. The fifth magnetic reluctance circuit, the sixth magnetic reluctance circuit, the seventh magnetic reluctance circuit and the eighth magnetic reluctance circuit each include at least one second magnetic tunnel junction. A second end of the fifth magnetic reluctance circuit is connected to a first end of the sixth magnetic reluctance circuit, a second end of the sixth magnetic reluctance circuit is connected to a first end of the seventh magnetic reluctance circuit, a second end of the seventh magnetic reluctance circuit is connected to a first end of the eighth magnetic reluctance circuit, and a second end of the eighth magnetic reluctance circuit is connected to a first end of the fifth magnetic reluctance circuit. The second positive output port is respectively connected to the first end of the fifth magnetic reluctance circuit and the second end of the eighth magnetic reluctance circuit, the second negative output port is respectively connected to the second end of the sixth magnetic reluctance circuit and the first end of the seventh magnetic reluctance circuit, the voltage input port is respectively connected to the second end of the fifth magnetic reluctance circuit and the first end of the sixth magnetic reluctance circuit; and the ground port is respectively connected to the second end of the seventh magnetic reluctance circuit and the first end of the eighth magnetic reluctance circuit.

In some embodiments, the magnetic tunnel junctions include a magnetic multilayer film of an insulator and/or a semiconductor.

In a second aspect, the present disclosure provides a method for manufacturing a wide-range perpendicular sensitive magnetic sensor, the method includes: preparing a plurality of magnetic tunnel junctions on a substrate, the plurality of magnetic tunnel junctions including at least one first magnetic tunnel junction and at least one second magnetic tunnel junction; preparing connection lines on the substrate, the connection lines including a first connection line for connecting the at least one first magnetic tunnel junction and a first output port, and a second connection line for connecting the at least one second magnetic tunnel junction and a second output port, the first output port and the second output port being both configured to output a sensing signal representing a magnetic induction intensity of a magnetic field in a Z-axis direction, the Z-axis direction being a direction perpendicular to the substrate; wherein a magnetic sensing direction of the at least one first magnetic tunnel junction is a positive direction of the Z-axis, and a magnetic sensing direction of the at least one second magnetic tunnel junction is a negative direction of the Z-axis; or the magnetic sensing direction of the at least one first magnetic tunnel junction is the negative direction of the Z-axis, and the magnetic sensing direction of the at least one second magnetic tunnel junction is the positive direction of the Z-axis; wherein the magnetic sensor includes a voltage input port and a ground port; wherein the first output port includes a first positive output port and a first negative output port, and the first output port is configured to output a voltage of the at least one first magnetic tunnel junction; the first positive output port, the first negative output port, the voltage input port, the ground port and the at least one first magnetic tunnel junction forming a first push-pull Wheatstone full-bridge structure; the first output port obtaining a first output voltage of the at least one first magnetic tunnel junction; the first output voltage being linearly related to magnetic reluctance of the at least one first magnetic tunnel junction, and the magnetic reluctance of the at least one first magnetic tunnel junction being linearly related to an external magnetic field; wherein the second output port includes a second positive output port and a second negative output port, and the second output port is configured to output a voltage of the at least one second magnetic tunnel junction; the second positive output port, the second negative output port, the voltage input port, the ground port, and the at least one second magnetic tunnel junction forming a second push-pull Wheatstone full-bridge structure; the second output port obtaining a second output voltage of the at least one second magnetic tunnel junction; the second output voltage being linearly related to magnetic reluctance of the at least one second magnetic tunnel junction, and the magnetic reluctance of the at least one second magnetic tunnel junction being linearly related to the external magnetic field; and preparing a plurality of magnetic flux regulators above the plurality of magnetic tunnel junctions based on positions of the at least one first magnetic tunnel junction and the at least one second magnetic tunnel junction on the substrate, such that the at least one first magnetic tunnel junction is located below the magnetic flux regulator and edges of the at least one first magnetic tunnel junction not exceed edges of the magnetic flux regulator from a top-down perspective, the at least one second magnetic tunnel junction is located below a gap between two adjacent magnetic flux regulators, and edges of the at least one second magnetic tunnel junction not contact with the edges of the magnetic flux regulator on either side from the top-down perspective. The at least one first magnetic tunnel junction and the at least one second magnetic tunnel junction are arranged in partitions on the substrate.

In some embodiments, the preparing the plurality of magnetic tunnel junctions on the substrate includes: generating a TMR multilayer film structure on the substrate; etching the TMR multilayer film structure to obtain a plurality of magnetic tunnel junction units arranged in rows, each row of the magnetic tunnel junction unit forming the magnetic tunnel junction; and annealing the plurality of magnetic tunnel junction units to obtain the at least one first magnetic tunnel junction and the at least one second magnetic tunnel junction. Wherein a magnetic sensing direction of the at least one first magnetic tunnel junction is a positive direction of the Z-axis, and a magnetic sensing direction of the at least one second magnetic tunnel junction is a negative direction of the Z-axis; or the magnetic sensing direction of the at least one first magnetic tunnel junction is the negative direction of the Z-axis, and the magnetic sensing direction of the at least one second magnetic tunnel junction is the positive direction of the Z-axis.

In some embodiments, the connection lines further includes a third connection line for connecting the at least one first magnetic tunnel junction, the voltage input port, and the ground port, and a fourth connection line for connecting the at least one second magnetic tunnel junction, the voltage input port, and the ground port.

In some embodiments, the preparing the connection lines on the substrate includes: preparing a portion of the connecting lines on the substrate with the at least one first magnetic tunnel junction and the at least one second magnetic tunnel junction alternately arranged on the substrate; and depositing a layer of insulating material and depositing a layer of conductive material on the insulating material, and etching the conductive material to prepare another portion of the connection lines.

One or more embodiments of the present disclosure will be described in detail below with reference to drawings. Other features, objects and advantages of the present disclosure will become more apparent from the description, drawings, and claims.

DETAILED DESCRIPTION OF THE EMBODIMENTS

Figure 1:
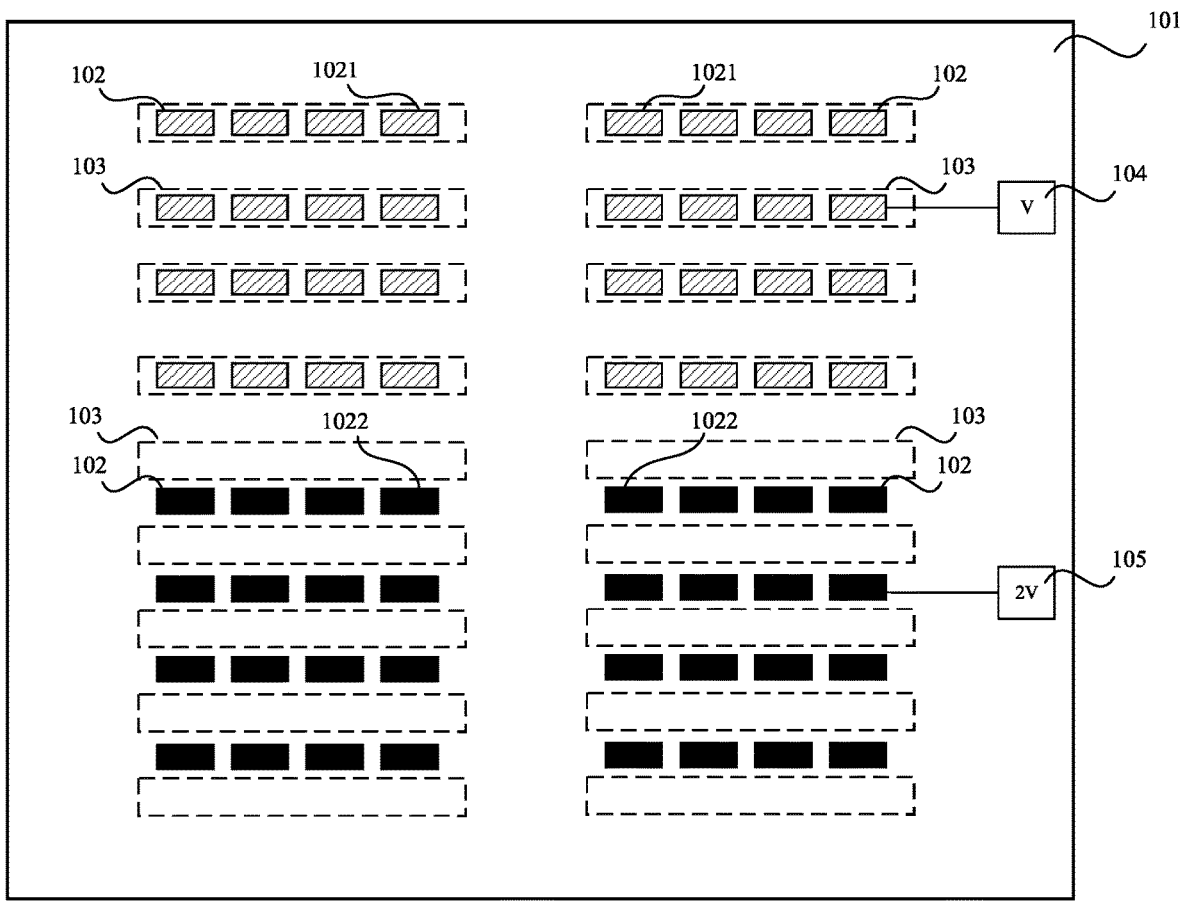
FIG. 1 is a schematic diagram showing an internal configuration of a wide-range perpendicular sensitive magnetic sensor according to some embodiments.

In order to facilitate understanding of the present disclosure, the present disclosure will be described more fully below with reference to the relevant accompanying drawings. Embodiments of the present disclosure are presented in the accompanying drawings. However, the present disclosure may be implemented in many different forms and is not limited to the embodiments described herein. Rather, these embodiments are provided for the purpose of making the present disclosure more thorough and comprehensive.

Unless otherwise defined, all technical and scientific terms used herein have the same meaning as commonly understood by those skilled in the technical field to which the present disclosure belongs. The terms used herein in the specification of the application are for the purpose of describing specific embodiments only, and are not intended to limit the present disclosure.

It will be understood that the terms "first", "second", etc. used in this disclosure may be used herein to describe various elements, but these elements are not limited by these terms. These terms are only used to distinguish the first element from another element. For example, the first magnetic tunnel junction may be referred to as the second magnetic tunnel junction, and similarly, the second magnetic tunnel junction may be referred to as the first magnetic tunnel junction, without departing from the scope of the present disclosure. Both the first magnetic tunnel junction and the second magnetic tunnel junction are magnetic tunnel junctions, but they are not the same magnetic tunnel junction.

As a modern cutting-edge technology, magnetic sensors can convert changes of a magnetic field into other physical changes to realize a detection function of the magnetic field. Magnetic sensors are small in size and low in price, and can be integrated with other circuits on a chip to achieve higher performance. Therefore, magnetic sensors are widely used in various practical scenarios, such as geological exploration, biomedicine, automotive industry, electronic products, etc., which greatly improves people's working efficiency and increase the convenience of life.

Currently, with the development of magnetic field detection technology, many different types of magnetic sensors for measuring magnetic fields and other parameters have emerged in the related art, such as Hall elements, anisotropic magnetoresistive (AMR) elements, giant magnetoresistive (GMR) elements, tunneling magnetoresistive (TMR) elements, giant magnetic impedance (GMI) elements, and so on. A Hall element is a semiconductor device that applies the Hall effect. A magnetic sensor that uses the Hall element as a sensitive element typically uses a magnetism gathering annular structure to amplify the magnetic field.

However, with the increasing demand for magnetic sensors and the increasing complexity of application scenarios, magnetic sensors of different technologies have their own advantages in range, sensitivity, and other aspects. For different magnetic fields, different detection ranges are often required to achieve full coverage detection. However, the two indicators of sensitivity and range of different magnetic sensors have problems in practical application requirements. For example, for the Hall elements, low sensitivity is the main problem. The TMR element has a problem in that sensitivity and range are constrained to each other under a certain size of the TMR element. Therefore, the problem of simultaneously improving the sensitivity and range of the magnetic sensor needs to be solved urgently.

The embodiments of the present disclosure provide a wide-range perpendicular sensitive magnetic sensor, which can simultaneously achieve high sensitivity and wide range in performance, and solve the problem of mutual constraints between the sensitivity and the range, making the two indicators of the sensitivity and the range be able to be expanded simultaneously.

In some embodiments, a wide-range perpendicular sensitive magnetic sensor is provided, as shown in FIG. 1. The magnetic sensor includes a substrate 101, a plurality of magnetic tunnel junctions 102, a plurality of magnetic flux regulators 103, a first output port 104 and a second output port 105. The plurality of magnetic tunnel junctions 102 are arranged on the substrate 101, and the plurality of magnetic flux regulators 103 are arranged above the plurality of magnetic tunnel junctions 102. The plurality of magnetic tunnel junctions 102 include at least one first magnetic tunnel junction 1021 and at least one second magnetic tunnel junction 1022. The at least one first magnetic tunnel junction 1021 is located below the magnetic flux regulator 103, and the at least one second magnetic tunnel junction 1022 is located below a gap between two adjacent magnetic flux regulators 103. The first output port 104 is connected to the at least one first magnetic tunnel junction 1021, and the second output port 105 is connected to the at least one second magnetic tunnel junction 1022. The first output port 104 and the second output port 105 are both configured to output a sensing signal representing a magnetic induction intensity of a magnetic field in a Z-axis direction, and the Z-axis direction is a direction perpendicular to the substrate 101.

In particular, it should be noted that only a portion of the magnetic tunnel junctions 102 and magnetic flux regulators 103 are shown in FIG. 1, but the reader should understand that the configuration of the wide-range perpendicular sensitive magnetic sensor is not limited to the above number of the magnetic tunnel junctions 102 and magnetic flux regulators 103.

In addition, in the wide-range perpendicular sensitive magnetic sensor shown in the embodiments of the present disclosure, although FIG. 1 does not show a specific connection relationship, the reader should understand that connection lines may alternatively be used. For example, the at least one first magnetic tunnel junction 1021, the at least one second magnetic tunnel junction 1022, the first output port 104, and the second output port 105 can be connected by connection lines.

In some possible implementations, the at least one first magnetic tunnel junction 1021 is located below the magnetic flux regulator 103, and the term "below" in the embodiments of the present disclosure only represents a positional relationship. Optionally, from a top-down perspective, being located below the magnetic flux regulator 103 may mean that the at least one first magnetic tunnel junction 1021 may be directly below, at the lower left, or at the lower right of the magnetic flux regulator 103. However, it should be particularly noted that the magnetic flux regulator 103 should completely cover the at least one first magnetic tunnel junction 1021, i.e., edges of the at least one first magnetic tunnel junction 1021 should not exceed edges of the magnetic flux regulator 103, in order to ensure that an environment outside the edges of the magnetic flux regulator 103 does not interfere with an impact of the magnetic flux regulator 103 on the magnetic induction intensity of the at least one first magnetic tunnel junction 1021.

Similarly, the at least one second magnetic tunnel junction 1022 is located below the gap between the two adjacent magnetic flux regulators 103, and the description "below the gap" in the embodiments of the present disclosure only represents a positional relationship. Optionally, from the top-down perspective, being below the gap may mean that the at least one second magnetic tunnel junction 1022 may be directly below the gap between the two adjacent magnetic flux regulators 103, or below the gap between two adjacent magnetic flux regulators 103 while being closer to of the adjacent magnetic flux regulators 103. However, it should be particularly noted that edges of the at least one second magnetic tunnel junction 1022 should not be in contact with the edges of the magnetic flux regulator 103 on either side, in order to ensure that an environment within the edges of the magnetic flux regulator 103 does not interfere with an impact of the magnetic flux regulator 103 on the magnetic induction intensity of the at least one second magnetic tunnel junction 1022.

The magnetic tunnel junction 102 is a magnetic field sensitive basic unit of the TMR element, and is a magnetic multilayer film of an insulator or a semiconductor. Under an action of a voltage across an insulating layer, a tunnel current and a tunnel resistance of the magnetic tunnel junction 102 depend on a relative orientation of magnetization intensity of two ferromagnetic layers. When a direction of magnetization intensity of a magnetic free layer changes under an action of an external field, while a direction of magnetization of a pinned layer remains unchanged, the relative orientation of the magnetization intensity of the two magnetic layers changes, and a large change in resistance is observed at the magnetic tunnel junction across the insulating layer, i.e., the TMR element uses a change of the magnetic field to cause the change of magnetoresistance. On the other hand, the change of the external magnetic field can be measured by observing the change of the resistance of the TMR element. In other words, the TMR element can be considered to be similar to a resistor which resistance value changes when an applied magnetic field changes.

The magnetic flux regulator 103 is a device that can change the magnetic field distribution. Optionally, the magnetic flux regulator 103 may be made of a ferromagnetic alloy that contains one or more elements of Ni、Fe、Co、Si、B、Zr and Al, and the magnetic flux regulator 103 may be in the shape of an elongated strip. The magnetic flux regulator 103 can be used to change the magnetic induction intensity at the magnetic tunnel junction 102 to achieve two effects of enhancement and weakening of the magnetic induction intensity.

Specifically, in the embodiments of the present disclosure, the plurality of magnetic flux regulators 103 are used to change the magnetic induction intensity at the plurality of magnetic tunnel junctions 102 to achieve two effects of enhancement and weakening of the magnetic induction intensity. Using the magnetic sensor including a plurality of magnetic tunnel junctions 102 at a position where the magnetic induction intensity is enhanced, the sensitivity is improved and a weaker magnetic field can be detected. Using the magnetic sensor including a plurality of magnetic tunnel junctions 102 at a position where the magnetic induction intensity is attenuated, the sensitivity is reduced, and a magnetic field with a larger range can be detected. By combining the magnetic sensors with the two effects, the magnetic detection with high sensitivity and wide range can be achieved at the same time, and a detection upper limit and a detection lower limit of the perpendicular sensitive magnetic sensor is expanded, thereby solving the problem that the magnetic sensor cannot expand simultaneously in the two indexes of sensitivity and range.

In some alternative embodiments of the present disclosure, a magnetic sensing direction of the at least one first magnetic tunnel junction 1021 is a positive direction of the Z-axis, and a magnetic sensing direction of the at least one second magnetic tunnel junction 1022 is a negative direction of the Z-axis. Alternatively, the magnetic sensing direction of the at least one first magnetic tunnel junction 1021 is the negative direction of the Z-axis, and the magnetic sensing direction of the at least one second magnetic tunnel junction 1022 is the positive direction of the Z-axis. Most of the conventional magnetic sensors adopt a magnetic sensing direction parallel to the sensor, which increases the resistance of the material and affects an accuracy of the detection result. In contrast, the magnetic sensing direction of the embodiments of the present disclosure adopts the perpendicular magnetic sensing direction, which can better improve the detection accuracy.

Figure 2:
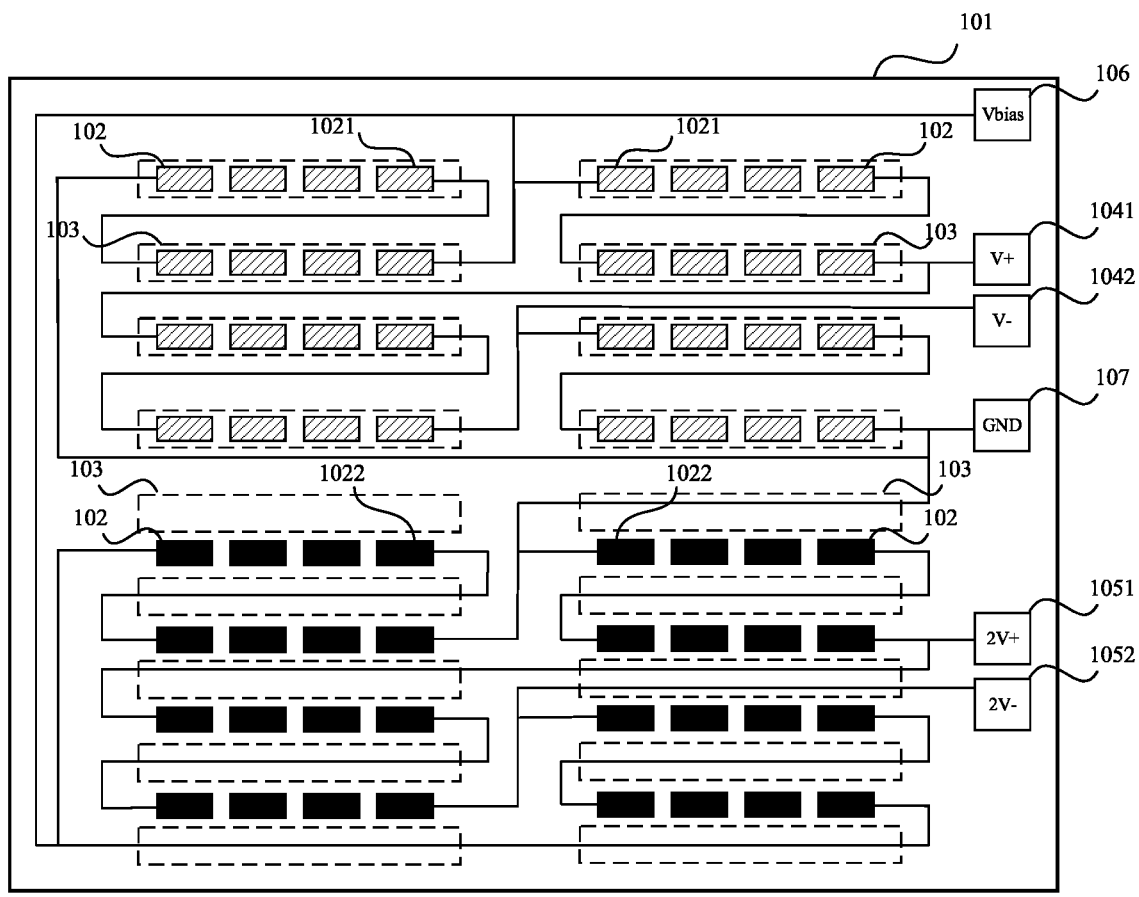
FIG. 2 is a schematic diagram showing an internal configuration of a wide-range perpendicular sensitive magnetic sensor according to some other embodiments.

For a better understanding of the wide-range perpendicular sensitive magnetic sensor provided by embodiments of the present application, please continue to refer to FIG. 2, which shows an exemplary internal configuration of the magnetic sensor based on FIG. 1. The configuration of the magnetic sensor not only includes the above-mentioned substrate 101, the plurality of magnetic tunnel junctions 102, the plurality of magnetic flux regulators 103, the first output port 104 and the second output port 105, but also includes a voltage input port 106 and a ground port 107. The voltage input port 106 and the ground port 107 are both connected to the at least one first magnetic tunnel junction 1021 and the at least one second magnetic tunnel junction 1022. The first output port 104 includes a first positive output port 1041 and a first negative output port 1042. The first positive output port 1041, the first negative output port 1042, the voltage input port 106, the ground port 107, and the at least one first magnetic tunnel junction 1021 form a first push-pull Wheatstone full-bridge structure. The second output port 105 includes a second positive output port 1051 and a second negative output port 1052. The second positive output port 1051, the second negative output port 1052, the voltage input port 106, the ground port 107, and the at least one second magnetic tunnel junction 1022 form a second push-pull Wheatstone full-bridge structure.

Each output port and each component are connected by connection lines, and some optional embodiments are provided below to illustrate the connection relationship.

In some embodiments, the wide-range perpendicular sensitive magnetic sensor includes a plurality of first magnetic tunnel junctions 1021. The plurality of first magnetic tunnel junctions 1021 form a first magnetic reluctance circuit, a second magnetic reluctance circuit, a third magnetic reluctance circuit and a fourth magnetic reluctance circuit. The first magnetic reluctance circuit, the second magnetic reluctance circuit, the third magnetic reluctance circuit and the fourth magnetic reluctance circuit each include at least one first magnetic tunnel junction 1021. A first end of the first magnetic reluctance circuit is connected to a first end of the second magnetic reluctance circuit, a second end of the second magnetic reluctance circuit is connected to a first end of the third magnetic reluctance circuit, a second end of the third magnetic reluctance circuit is connected to a first end of the fourth magnetic reluctance circuit, and a second end of the fourth magnetic reluctance circuit is connected to a second end of the first magnetic reluctance circuit. The first positive output port is respectively connected to the first end of the first magnetic reluctance circuit and the second end of the fourth magnetic reluctance circuit, the first negative output port is respectively connected to the second end of the second magnetic reluctance circuit and the first end of the third magnetic reluctance circuit, the voltage input port 106 is respectively connected to the second end of the first magnetic reluctance circuit and the first end of the second magnetic reluctance circuit, and the ground port 107 is respectively connected to the second end of the third magnetic reluctance circuit and the first end of the fourth magnetic reluctance circuit.

In some embodiments, the wide-range perpendicular sensitive magnetic sensor includes a plurality of second magnetic tunnel junctions 1022. The plurality of second magnetic tunnel junctions 1022 form a fifth magnetic reluctance circuit, a sixth magnetic reluctance circuit, a seventh magnetic reluctance circuit and an eighth magnetic reluctance circuit. The fifth magnetic reluctance circuit, the sixth magnetic reluctance circuit, the seventh magnetic reluctance circuit and the eighth magnetic reluctance circuit each include at least one second magnetic tunnel junction 1022. A second end of the fifth magnetic reluctance circuit is connected to a first end of the sixth magnetic reluctance circuit, a second end of the sixth magnetic reluctance circuit is connected to a first end of the seventh magnetic reluctance circuit, a second end of the seventh magnetic reluctance circuit is connected to a first end of the eighth magnetic reluctance circuit, and a second end of the eighth magnetic reluctance circuit is connected to a first end of the fifth magnetic reluctance circuit. The second positive output port is respectively connected to the first end of the fifth magnetic reluctance circuit and the second end of the eighth magnetic reluctance circuit, the second negative output port is respectively connected to the second end of the sixth magnetic reluctance circuit and the first end of the seventh magnetic reluctance circuit, the voltage input port 106 is respectively connected to the second end of the fifth magnetic reluctance circuit and the first end of the sixth magnetic reluctance circuit; and the ground port 107 is respectively connected to the second end of the seventh magnetic reluctance circuit and the first end of the eighth magnetic reluctance circuit.

The magnetic reluctance circuit may be understood as the magnetic tunnel junction 102 described above, while the magnetic reluctance circuit is operating as a magnetic reluctance element. Since magnetic reluctance refers to a hindering effect that a magnetic flux receives when passing through the magnetic circuit, and there is no standard uniform element for practical applications, the magnetic reluctance circuit in the embodiments of the present disclosure can be used as the magnetic reluctance element based on the properties of the above-mentioned TMR element. The plurality of magnetic tunnel junctions 102 form a plurality of magnetic reluctance circuits, and the plurality of magnetic reluctance circuits are connected to each port to form a push-pull Wheatstone full-bridge structure.

The above embodiments illustrate the connection relationship of the ports and the function of each port will be described below. The first output port 104 is configured to output a voltage of the magnetic reluctance circuit including the first magnetic tunnel junctions 1021, the second output port 105 is configured to output a voltage of the magnetic reluctance circuit including the second magnetic tunnel junctions 1022, the voltage input port 106 is configured to input a given voltage to excite circuit, and the ground port 107 is configured to protect the circuit. Changes in the output voltages of the plurality of magnetic tunnel junctions 102 at different positions obtained by the first output port 104 and the second output port 105 can reflect the impact of the wide-range perpendicular sensitive magnetic sensor of the present disclosure on the magnetic field detection.

Figure 3:
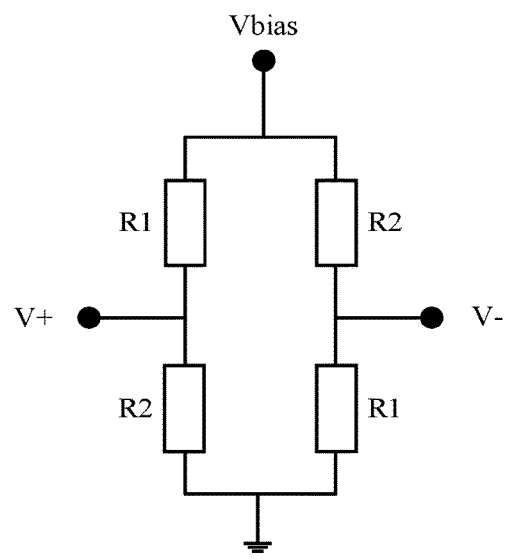
FIG. 3 is a schematic diagram showing a circuit configuration of a push-pull Wheatstone full-bridge according to some embodiments.

As described above, the first positive output port 1041, the first negative output port 1042, the voltage input port 106, the ground port 107, and the at least one first magnetic tunnel junction 1021 form the first push-pull Wheatstone full-bridge structure, and the second positive output port 1051, the second negative output port 1052, the voltage input port 106, the ground port 107, and the at least one second magnetic tunnel junction 1022 form the second push-pull Wheatstone full-bridge structure. The push-pull Wheatstone full-bridge structure is shown in FIG. 3. The push-pull Wheatstone full-bridge structure includes four ports, including the input port configured to the input voltage $V_{bias}$, the ground port GND, the positive output port configured to the positive output voltage V+, and the negative output port configured to the negative output voltage V−, and includes a bridge circuit consisting of four resistors, including two resistors R1 and two resistors R2. These four resistors serve as bridge arms of the bridge respectively. The Wheatstone full-bridge uses the change of resistance to measure the change of physical quantity, and by acquiring a voltage of a variable resistor and processing the voltage, the corresponding change of the physical quantity can be calculated, which is a high-precision measurement method.

In some possible implementations, the push-pull Wheatstone full-bridge structure uses the plurality of magnetic tunnel junctions 102 as the magnetic reluctance. The output voltage V of the first output port 104 and the output voltage V of the second output port 105 are respectively acquired, and the output voltage V is denoted as the following formula:

$$V = V_+ - V_- = \frac{R_1}{R_1 + R_2} V_{bias} - \frac{R_2}{R_1 + R_2} V_{bias} = \frac{R_1 - R_2}{R_1 + R_2} V_{bias},$$

where V+ is the positive output voltage, V− is the negative output voltage, and $V_{bias}$ is the input voltage.

Based on the configuration of the first output port 104 and the second output port 105 as described above, it can be known that the resistors R1 and R2 correspondingly include the magnetic reluctance composed of two kinds of magnetic tunnel junctions. The first is that there are first magnetic tunnel junctions 1021, i.e., the plurality of first magnetic tunnel junctions 1021 form two resistors R1 of the Wheatstone full-bridge structure, and the remaining plurality of first magnetic tunnel junctions 1021 form two resistors R2 of the Wheatstone full-bridge structure. The second is that there are second magnetic tunnel junctions 1022, i.e., the plurality of second magnetic tunnel junctions 1022 form two resistors R1 of the Wheatstone full-bridge structure, and the remaining plurality of second magnetic tunnel junctions 1022 form two resistors R2 of the Wheatstone full-bridge structure.

The change of the output voltage can be obtained by calculation, thereby the impact of the wide-range perpendicular sensitive magnetic sensor of the present disclosure on the magnetic field detection can be reflected.

Figure 4:
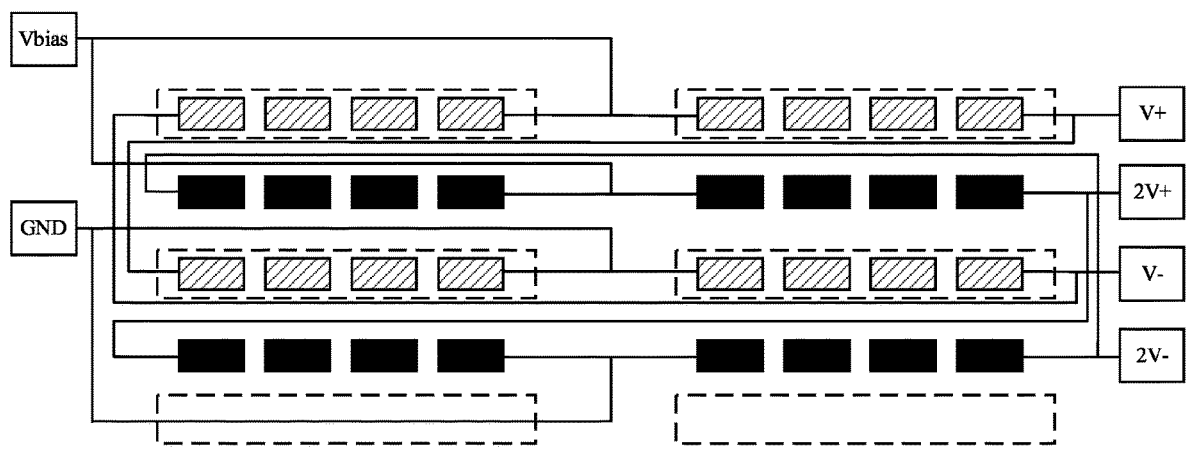
FIG. 4 is a schematic diagram showing an internal configuration of a chip of a wide-range perpendicular sensitive magnetic sensor according to some embodiments.

In some optional embodiments of the present disclosure, in addition to the arrangement method in which the at least one first magnetic tunnel junction 1021 and the at least one second magnetic tunnel junction 1022 are arranged in partitions on the substrate 101, the at least one first magnetic tunnel junction 1021 and the at least one second magnetic tunnel junction 1022 may be alternately arranged on the substrate 101 as shown in FIG. 4. The purpose of the alternating arrangement is to make better use of the chip area and reduce the chip volume.

Based on the foregoing, in some embodiments, the specific working principle of the wide-range perpendicular sensitive magnetic sensor provided by the present disclosure is described below.

In the first step, a magnetic field in the Z-axis direction is applied to the wide-range perpendicular sensitive magnetic sensor.

Figure 5:
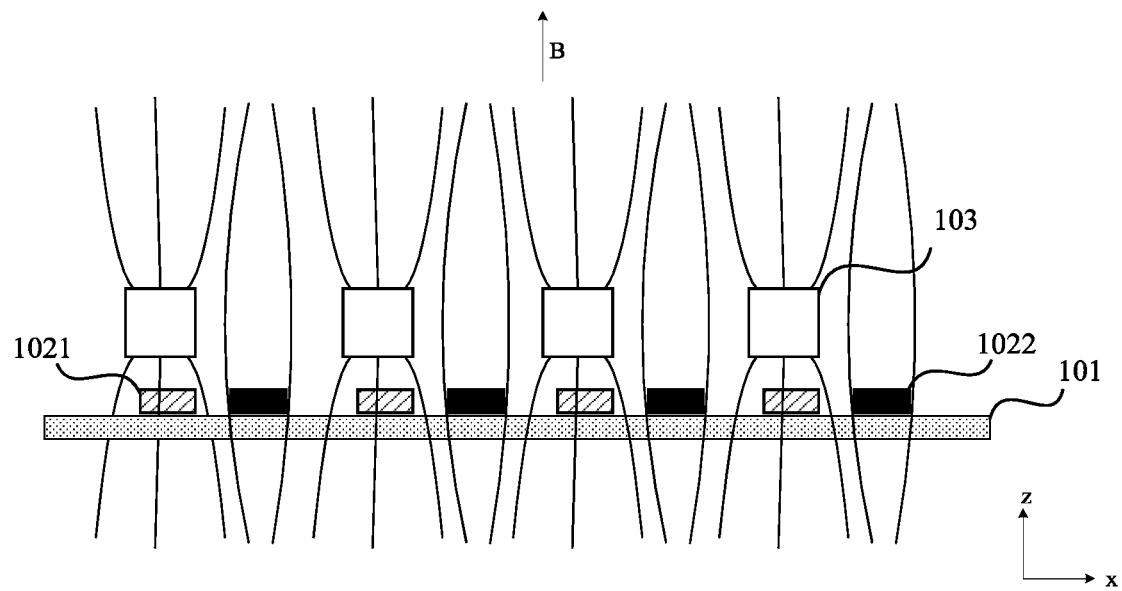
FIG. 5 is a side view showing a configuration of a wide-range perpendicular sensitive magnetic sensor according to some embodiments.

FIG. 5 is a side view showing a configuration of the wide-range perpendicular sensitive magnetic sensor in some optional embodiments. The magnetic field in the Z-axis direction is applied to the wide-range perpendicular sensitive magnetic sensor. FIG. 5 shows a cross-sectional view of the substrate 101, the at least one first magnetic tunnel junction 1021, the at least one second magnetic tunnel junction 1022, and the magnetic flux regulator 103. Each component is placed along the Y-axis in the figure. Although the specific Y-axis direction is not marked in the figure, readers can infer the Y-axis direction based on the marked X-axis direction and Z-axis direction.

Figure 6:
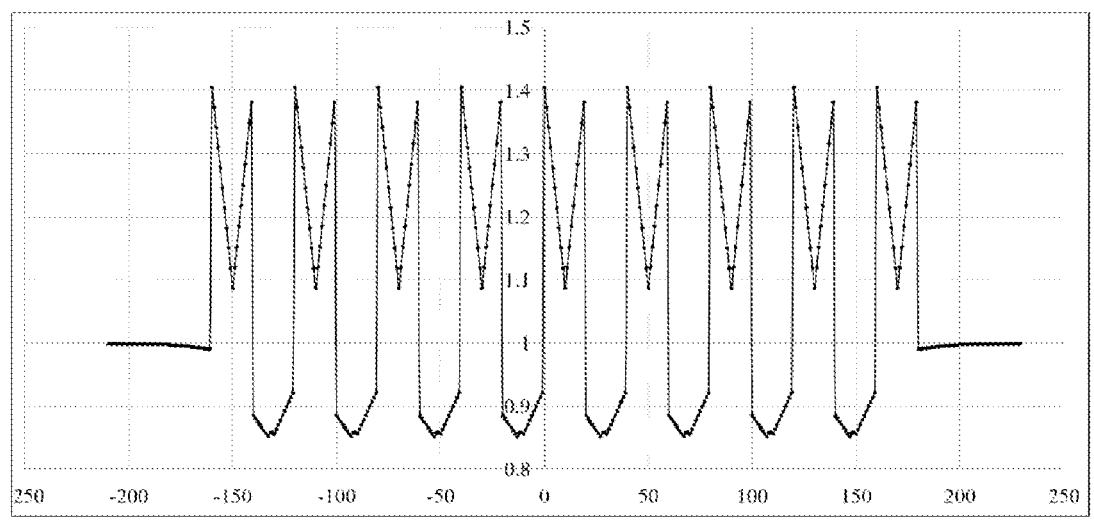
FIG. 6 is a diagram showing magnetic field components on the Z-axis at various points in a direction of a substrate according to some embodiments.

Based on simulation, the impact of the magnetic flux regulator 103 on magnetic induction intensity is shown in FIG. 6. FIG. 6 is a diagram showing magnetic field components on the Z-axis at various points in a direction of the substrate 101, i.e., the X-axis direction. In the figure, the horizontal axis is the position coordinate of the magnetic flux regulator 103, and the vertical axis is the magnetic induction intensity. Assuming an externally applied magnetic induction intensity is 1 Gs, the magnetic induction intensity of the at least one first magnetic tunnel junction 1021 located below the magnetic flux regulator 103 on the Z-axis is enhanced, the enhanced magnetic induction intensity is within the range of 1.1~1.4 Gs, and the magnetic field intensity is enhanced by about 30%. The magnetic induction intensity of the at least one second magnetic tunnel junction 1022 located below the gap between the two magnetic flux regulators 103 on the Z-axis is weakened, the weakened magnetic induction intensity is within the range of 0.85~0.92 Gs, and the magnetic field intensity is weakened by about 10%.

In the second step, the output voltage V of the output port is obtained based on the push-pull Wheatstone full-bridge bridge.

The output voltage V is denoted as the following formula:

$$V = V_+ - V_- = \frac{R_1}{R_1 + R_2} V_{bias} - \frac{R_2}{R_1 + R_2} V_{bias} = \frac{R_1 - R_2}{R_1 + R_2} V_{bias},$$

where V+ is the positive output voltage, V− is the negative output voltage, and $V_{bias}$ is the input voltage.

From the above-mentioned existence of the first output port 104 and the second output port 105, there are two cases where the magnetic tunnel junctions 102 form the resistors R1 and R2. The first is that there are first magnetic tunnel junctions 1021, i.e., the plurality of first magnetic tunnel junctions 1021 form two resistors R1 of the Wheatstone full-bridge structure, and the remaining plurality of first magnetic tunnel junctions 1021 form two resistors R2 of the Wheatstone full-bridge structure. The second is that there are second magnetic tunnel junctions 1022, i.e., the plurality of second magnetic tunnel junctions 1022 form two resistors R1 of the Wheatstone full-bridge structure, and the remaining plurality of second magnetic tunnel junctions 1022 form two resistors R2 of the Wheatstone full-bridge structure.

In the third step, the output voltages of the first output port 104 and the second output port 105 are calculated respectively, and the detection effect of the wide-range perpendicular sensitive magnetic sensor is verified.

In some possible implementations, the output voltage of the magnetic sensor is linearly related to the magnetic reluctance of the TMR element, in other words, the output voltage of the magnetic sensor is linearly related to the magnetic reluctance circuit formed by the magnetic tunnel junction 102, and the change of the output voltage reflects the change of the magnetic reluctance circuit.

Figure 7:
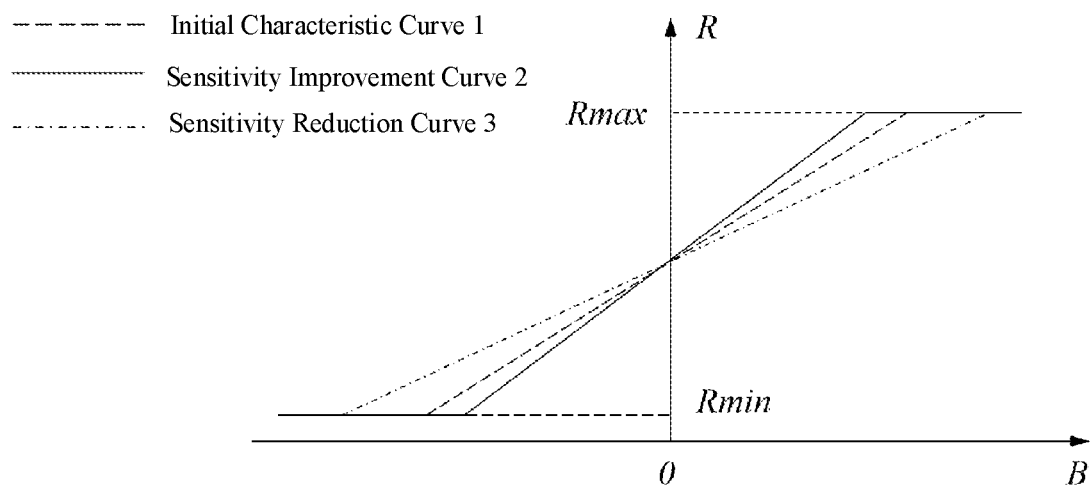
FIG. 7 is a diagram showing a linear relationship between magnetic reluctance and an external magnetic field according to some embodiments.

Further, as shown in FIG. 7, the magnetic reluctance of the magnetic tunnel junction 102 has a linear relationship with the external magnetic field within a certain range. The horizontal axis B is the magnitude of the magnetic induction intensity of the external magnetic field, and the vertical axis R is the magnitude of the magnetic reluctance in FIG. 7. Once a size of the TMR element is determined, a change range of the magnetic reluctance is determined, i.e., the maximum magnetic reluctance Rmax and the minimum magnetic reluctance Rmin are determined.

Assume that with the change of the magnetic field, the change of the voltage of the first output port 104 increases by 30%, and the change of the voltage of the second output port 105 decreases by 10%. If the push-pull Wheatstone full-bridge structure formed by the first magnetic tunnel junctions 1021 is used, due to the existence of the magnetic flux regulator 103, the induced change of the magnetic field is increased by 30% when the magnetic reluctance of the tunnel junction changes with the magnetic field, and the sensitivity improvement curve 2 is obtained. A smaller magnetic field will cause a larger output, so that a detection lower limit of the magnetic sensor is increased by 30%, and the detection sensitivity is improved.

If the push-pull Wheatstone full-bridge structure formed by the second magnetic tunnel junctions 1022 is used, due to the existence of the magnetic flux regulator 103, the induced change of the magnetic field is reduced by 10% when the magnetic reluctance of the tunnel junction changes with the magnetic field, and the sensitivity reduction curve 3 is obtained. the weak change of the magnetic field is no longer sensed, so that a wider output range can be detected stably, so that a detection upper limit of the magnetic sensor is increased by about 10%, and the detection range is increased.

In some embodiments, the present disclosure is provided a wide-range perpendicular sensitive magnetic sensor. The magnetic sensor includes a substrate 101, a plurality of magnetic tunnel junctions 102, a plurality of magnetic flux regulators 103, a first output port 104, a second output port 105, a voltage input port 106 and a ground port 107. The plurality of magnetic tunnel junctions 102 are arranged on the substrate 101. The magnetic tunnel junction 102 includes at least one first magnetic tunnel junction 1021 and at least one second magnetic tunnel junction 1022. The at least one first magnetic tunnel junction 1021 is located below the magnetic flux regulator 103, and the at least one second magnetic tunnel junction 1022 is located below a gap between two adjacent magnetic flux regulators 103. Optional, the magnetic tunnel junction 102 can be arranged in partitions or alternately. The first output port 104 is connected to the at least one first magnetic tunnel junction 1021, and the second output port 105 is connected to the at least one second magnetic tunnel junction 1022. The first output port 104 and the second output port 105 are both configured to output a sensing signal representing a magnetic induction intensity of a magnetic field in a Z-axis direction, and the Z-axis direction is a direction perpendicular to the substrate 101. The output port includes a positive output port and a negative output port, and Each port and each component are connected by connection lines. The positive output port, the negative output port, the voltage input port 106, the ground port 107 and the magnetic tunnel junctions 102 are connected to form a push-pull Wheatstone full-bridge structure. Further, the magnetic flux regulator 103 is used to change the magnetic induction intensity at the magnetic tunnel junction 102 to achieve two effects of enhancement and weakening. Using a magnetic sensor consisting of magnetic tunnel junctions 102 at a position where the magnetic induction intensity is enhanced, the sensitivity is improved and a weaker magnetic field can be detected. Using a magnetic sensor consisting of magnetic tunnel junctions 102 at a position where the magnetic induction intensity is attenuated, the sensitivity is reduced, but a magnetic field with a larger range can be detected. By combining the magnetic sensors with the two effects, the magnetic detection results with high sensitivity and wide range can be achieved at the same time, and a detection upper limit and a detection lower limit of the perpendicular sensitive magnetic sensor is expanded.

In some embodiments, the present disclosure is provided a method for manufacturing a wide-range perpendicular sensitive magnetic sensor, including following steps.

A plurality of magnetic tunnel junctions 102 are prepared on a substrate 101, the plurality of magnetic tunnel junctions 102 include at least one first magnetic tunnel junction 1021 and at least one second magnetic tunnel junction 1022. Connection lines are prepared on the substrate 101, the connection lines include a first connection line for connecting the at least one first magnetic tunnel junction 1021 and a first output port 104, and a second connection line for connecting the at least one second magnetic tunnel junction 1022 and a second output port 105. The first output port 104 and the second output port 105 are both configured to output a sensing signal representing a magnetic induction intensity of a magnetic field in a Z-axis direction, the Z-axis direction is a direction perpendicular to the substrate. A plurality of magnetic flux regulators 103 are prepared above the plurality of magnetic tunnel junctions 102 based on positions of the at least one first magnetic tunnel junction 1021 and the at least one second magnetic tunnel junction 1022 on the substrate, such that the at least one first magnetic tunnel junction 1021 is located below the magnetic flux regulator 103, and the at least one second magnetic tunnel junction 1022 is located below a gap between two adjacent magnetic flux regulators 103.

In some embodiments, the preparing the plurality of magnetic tunnel junctions 102 on the substrate 101 includes following steps.

A TMR multilayer film structure is generated on the substrate 101. The TMR multilayer film structure is etched to obtain a plurality of magnetic tunnel junction units arranged in rows, and each row of the magnetic tunnel junction unit forms the magnetic tunnel junction 102. The plurality of magnetic tunnel junction units are annealed to obtain the at least one first magnetic tunnel junction 1021 and the at least one second magnetic tunnel junction 1022. A magnetic sensing direction of the at least one first magnetic tunnel junction 1021 is a positive direction of the Z-axis, and a magnetic sensing direction of the at least one second magnetic tunnel junction 1022 is a negative direction of the Z-axis, or the magnetic sensing direction of the at least one first magnetic tunnel junction 1021 is the negative direction of the Z-axis, and the magnetic sensing direction of the at least one second magnetic tunnel junction 1022 is the positive direction of the Z-axis.

The annealing is a metal heat treatment process in which the metal is slowly heated to a certain temperature, held for a sufficient time, and then cooled at a suitable rate. The purpose of an annealing treatment is to reduce hardness, improve machinability, eliminate residual stress, stabilize size, reduce deformation and crack tendency, refine grain, adjust structure and eliminate structure defects. To be precise, the annealing treatment is a heat treatment process for materials, including metal materials and non-metal materials.

In some embodiments, the connection lines further includes a third connection line for connecting the at least one first magnetic tunnel junction 1021, the voltage input port 106, and the ground port 107, and a fourth connection line for connecting the at least one second magnetic tunnel junction 1022, the voltage input port 106, and the ground port 107.

In some embodiments, the preparing the connection lines on the substrate 101 includes following steps.

A portion of the connecting lines are prepared on the substrate 101 with the at least one first magnetic tunnel junction 1021 and the at least one second magnetic tunnel junction 1022 alternately arranged on the substrate. A layer of insulating material is deposited, and a layer of conductive material is deposited on the insulating material, and the conductive material is etched to prepare another portion of the connection lines.

The above wide-range perpendicular sensitive magnetic sensor and the method for manufacturing the same, provide a wide-range perpendicular sensitive magnetic sensor, including a substrate, a plurality of magnetic tunnel junctions, a plurality of magnetic flux regulators, a first output port and a second output port. The plurality of magnetic flux regulators are used to change the magnetic induction intensity at the plurality of magnetic tunnel junctions to achieve two effects of enhancement and weakening. Using a magnetic sensor including a plurality of magnetic tunnel junctions at a position where the magnetic induction intensity is enhanced, the sensitivity is improved and a weaker magnetic field can be detected. Using a magnetic sensor including a plurality of magnetic tunnel junctions at a position where the magnetic induction intensity is attenuated, the sensitivity is reduced, but a magnetic field with a larger range can be detected. By combining the magnetic sensors with the two effects, the magnetic detection results with high sensitivity and wide range can be achieved at the same time, and a detection upper limit and a detection lower limit of the perpendicular sensitive magnetic sensor is expanded, thereby solving the problem that the magnetic sensor cannot expand simultaneously on two indexes of sensitivity and range.

The technical features in the above embodiments can be combined arbitrarily. For concise description, not all possible combinations of the technical features in the above embodiments are described. However, all the combinations of the technical features are to be considered as falling within the scope described in this specification provided that they do not conflict with each other.

The above-mentioned embodiments only describe several implementations of the present disclosure, and their description is specific and detailed, but should not be understood as a limitation on the patent scope of the present disclosure. It should be pointed out that for those skilled in the art may further make variations and improvements without departing from the conception of the present disclosure, and these all fall within the protection scope of the present disclosure. Therefore, the protection scope of the present disclosure should be subject to the appended claims.

What is claimed is:

1. A wide-range perpendicular sensitive magnetic sensor, comprising:
    a substrate;
    a plurality of magnetic tunnel junctions;
    a plurality of magnetic flux regulators;
    a first output port; and
    a second output port,
    wherein the plurality of magnetic tunnel junctions are arranged on the substrate, the plurality of magnetic flux regulators are arranged above the plurality of magnetic tunnel junctions, the plurality of magnetic tunnel junctions include a first magnetic tunnel junction and a second magnetic tunnel junction, the first magnetic tunnel junction is located below the magnetic flux regulator, and the second magnetic tunnel junction is located below a gap between two adjacent magnetic flux regulators; the first magnetic tunnel junction and the second magnetic tunnel junction are arranged in partitions on the substrate;
    wherein the first output port is connected to the first magnetic tunnel junction, the second output port is connected to the second magnetic tunnel junction, the first output port and the second output port are both configured to output a sensing signal representing a magnetic induction intensity of a magnetic field in a Z-axis direction, and the Z-axis direction is a direction perpendicular to the substrate; wherein a magnetic sensing direction of the first magnetic tunnel junction is a positive direction of the Z-axis, and a magnetic sensing direction of the second magnetic tunnel junction is a negative direction of the Z-axis; or the magnetic sensing direction of the first magnetic tunnel junction is the negative direction of the Z-axis, and the magnetic sensing direction of the second magnetic tunnel junction is the positive direction of the Z-axis;
    wherein the magnetic sensor includes a voltage input port and a ground port;
    wherein the first output port includes a first positive output port and a first negative output port, and the first output port is configured to output a voltage of the first magnetic tunnel junction; the voltage of the first magnetic tunnel junction being linearly related to magnetic reluctance of the first magnetic tunnel junction, and the magnetic reluctance of the first magnetic tunnel junction being linearly related to an external magnetic field; the first positive output port, the first negative output port, the voltage input port, the ground port and the first magnetic tunnel junction forming a first push-pull Wheatstone full-bridge structure; and
    wherein the second output port includes a second positive output port and a second negative output port, and the second output port is configured to output a voltage of the second magnetic tunnel junction; the voltage of the second magnetic tunnel junction being linearly related to magnetic reluctance of the second magnetic tunnel junction, and the magnetic reluctance of the second magnetic tunnel junction being linearly related to the external magnetic field; the second positive output port, the second negative output port, the voltage input port, the ground port, and the second magnetic tunnel junction forming a second push-pull Wheatstone full-bridge structure.

2. The wide-range perpendicular sensitive magnetic sensor of claim 1, wherein the first magnetic tunnel junction and the second magnetic tunnel junction are alternately arranged on the substrate.

3. The wide-range perpendicular sensitive magnetic sensor of claim 1, wherein the voltage input port, the ground port, the first output port, the second output port, the first magnetic tunnel junction and the second magnetic tunnel junction are all connected by connecting lines.

4. The wide-range perpendicular sensitive magnetic sensor of claim 3, wherein the magnetic sensor includes a plurality of first magnetic tunnel junctions, the plurality of first magnetic tunnel junctions forming a first magnetic reluctance circuit, a second magnetic reluctance circuit, a third magnetic reluctance circuit and a fourth magnetic reluctance circuit, and the first magnetic reluctance circuit, the second magnetic reluctance circuit, the third magnetic reluctance circuit and the fourth magnetic reluctance circuit each comprising at least one first magnetic tunnel junction;
- a first end of the first magnetic reluctance circuit being connected to a first end of the second magnetic reluctance circuit, a second end of the second magnetic reluctance circuit being connected to a first end of the third magnetic reluctance circuit, a second end of the third magnetic reluctance circuit being connected to a first end of the fourth magnetic reluctance circuit, and a second end of the fourth magnetic reluctance circuit being connected to a second end of the first magnetic reluctance circuit;
- the first positive output port being respectively connected to the first end of the first magnetic reluctance circuit and the second end of the fourth magnetic reluctance circuit;
- the first negative output port being respectively connected to the second end of the second magnetic reluctance circuit and the first end of the third magnetic reluctance circuit;
- the voltage input port being respectively connected to the second end of the first magnetic reluctance circuit and the first end of the second magnetic reluctance circuit; and
- the ground port being respectively connected to the second end of the third magnetic reluctance circuit and the first end of the fourth magnetic reluctance circuit.

5. The wide-range perpendicular sensitive magnetic sensor of claim 3, wherein the magnetic sensor includes a plurality of second magnetic tunnel junctions, the plurality of second magnetic tunnel junctions forming a fifth magnetic reluctance circuit, a sixth magnetic reluctance circuit, a seventh magnetic reluctance circuit and an eighth magnetic reluctance circuit, and the fifth magnetic reluctance circuit, the sixth magnetic reluctance circuit, the seventh magnetic reluctance circuit and the eighth magnetic reluctance circuit each comprising at least one second magnetic tunnel junction;
- a second end of the fifth magnetic reluctance circuit being connected to a first end of the sixth magnetic reluctance circuit, a second end of the sixth magnetic reluctance circuit being connected to a first end of the seventh magnetic reluctance circuit, a second end of the seventh magnetic reluctance circuit being connected to a first end of the eighth magnetic reluctance circuit, and a second end of the eighth magnetic reluctance circuit being connected to a first end of the fifth magnetic reluctance circuit;
- the second positive output port being respectively connected to the first end of the fifth magnetic reluctance circuit and the second end of the eighth magnetic reluctance circuit;
- the second negative output port being respectively connected to the second end of the sixth magnetic reluctance circuit and the first end of the seventh magnetic reluctance circuit;
- the voltage input port being respectively connected to the second end of the fifth magnetic reluctance circuit and the first end of the sixth magnetic reluctance circuit; and
- the ground port being respectively connected to the second end of the seventh magnetic reluctance circuit and the first end of the eighth magnetic reluctance circuit.

6. The wide-range perpendicular sensitive magnetic sensor of claim 1, wherein the magnetic tunnel junctions includes a magnetic multilayer film of an insulator and/or a semiconductor.

7. The wide-range perpendicular sensitive magnetic sensor of claim 1, wherein edges of the first magnetic tunnel junction do not exceed edges of the magnetic flux regulator from a top-down perspective, and edges of the second magnetic tunnel junction do not contact with the edges of the magnetic flux regulator on either side from the top-down perspective.

8. A method for manufacturing a wide-range perpendicular sensitive magnetic sensor, the method comprising:
- preparing a plurality of magnetic tunnel junctions on a substrate, the plurality of magnetic tunnel junctions comprising a first magnetic tunnel junction and a second magnetic tunnel junction;
- preparing connection lines on the substrate, the connection lines comprising a first connection line for connecting the first magnetic tunnel junction and a first output port, and a second connection line for connecting the second magnetic tunnel junction and a second output port, the first output port and the second output port being both configured to output a sensing signal representing a magnetic induction intensity of a magnetic field in a Z-axis direction, the Z-axis direction being a direction perpendicular to the substrate; wherein a magnetic sensing direction of the first magnetic tunnel junction is a positive direction of the Z-axis, and a magnetic sensing direction of the second magnetic tunnel junction is a negative direction of the Z-axis; or the magnetic sensing direction of the first magnetic tunnel junction is the negative direction of the Z-axis, and the magnetic sensing direction of the second magnetic tunnel junction is the positive direction of the Z-axis;
- wherein the magnetic sensor includes a voltage input port and a ground port;
- wherein the first output port includes a first positive output port and a first negative output port, and the first output port is configured to output a voltage of the first magnetic tunnel junction; the first positive output port, the first negative output port, the voltage input port, the ground port and the first magnetic tunnel junction forming a first push-pull Wheatstone full-bridge structure; the first output port obtaining a first output voltage of the first magnetic tunnel junction; the first output voltage being linearly related to magnetic reluctance of the first magnetic tunnel junction, and the magnetic reluctance of the first magnetic tunnel junction being linearly related to an external magnetic field;
- wherein the second output port includes a second positive output port and a second negative output port, and the second output port is configured to output a voltage of the second magnetic tunnel junction; the second positive output port, the second negative output port, the voltage input port, the ground port, and the second magnetic tunnel junction forming a second push-pull Wheatstone full-bridge structure; the second output port obtaining a second output voltage of the second magnetic tunnel junction; the second output voltage being linearly related to magnetic reluctance of the second magnetic tunnel junction, and the magnetic reluctance of the second magnetic tunnel junction being linearly related to the external magnetic field; and
- preparing a plurality of magnetic flux regulators above the plurality of magnetic tunnel junctions based on positions of the first magnetic tunnel junction and the second magnetic tunnel junction on the substrate, such that the first magnetic tunnel junction is located below the magnetic flux regulator and the second magnetic tunnel junction is located below a gap between two adjacent magnetic flux regulators; the first magnetic tunnel junction and the second magnetic tunnel junction being arranged in partitions on the substrate.

9. The method of claim 8, wherein the step of preparing the plurality of magnetic tunnel junctions on the substrate includes:
generating a TMR multilayer film structure on the substrate;
etching the TMR multilayer film structure to obtain a plurality of magnetic tunnel junction units arranged in rows, each row of the magnetic tunnel junction unit forming the magnetic tunnel junction; and
annealing the plurality of magnetic tunnel junction units to obtain the first magnetic tunnel junction and the second magnetic tunnel junction;
wherein a magnetic sensing direction of the first magnetic tunnel junction is a positive direction of the Z-axis, and a magnetic sensing direction of the second magnetic tunnel junction is a negative direction of the Z-axis; or
the magnetic sensing direction of the first magnetic tunnel junction is the negative direction of the Z-axis, and the magnetic sensing direction of the second magnetic tunnel junction is the positive direction of the Z-axis.

10. The method of claim 8, wherein the connection lines further includes a third connection line for connecting the first magnetic tunnel junction, the voltage input port, and the ground port, and a fourth connection line for connecting the second magnetic tunnel junction, the voltage input port, and the ground port.

11. The method of claim 10, wherein the preparing the connection lines on the substrate includes:
preparing a portion of the connecting lines on the substrate with the first magnetic tunnel junction and the second magnetic tunnel junction alternately arranged on the substrate; and
depositing a layer of insulating material and depositing a layer of conductive material on the insulating material, and etching the conductive material to prepare another portion of the connection lines.

12. The method of claim 8, wherein edges of the first magnetic tunnel junction do not exceed edges of the magnetic flux regulator from a top-down perspective, and edges of the second magnetic tunnel junction do not contact with the edges of the magnetic flux regulator on either side from the top-down perspective.

* * * * *